US008830695B2

(12) United States Patent
Grespan

(10) Patent No.: US 8,830,695 B2
(45) Date of Patent: Sep. 9, 2014

(54) ENCAPSULATED ELECTRONIC DEVICE

(75) Inventor: Silvio Grespan, Penang (MY)

(73) Assignee: Osram Opto Semiconductors GmbH, Regensburg (DE)

(*) Notice: Subject to any disclaimer, the term of this patent is extended or adjusted under 35 U.S.C. 154(b) by 1069 days.

(21) Appl. No.: 11/766,028

(22) Filed: Jun. 20, 2007

(65) Prior Publication Data

US 2008/0180923 A1 Jul. 31, 2008

(30) Foreign Application Priority Data

Jan. 25, 2007 (DE) .......................... 10 2007 003 807
Mar. 15, 2007 (DE) .......................... 10 2007 012 504

(51) Int. Cl.
H01R 12/16 (2006.01)
H01L 51/52 (2006.01)
H01L 23/04 (2006.01)

(52) U.S. Cl.
CPC ... H01L 51/5237 (2013.01); H01L 2924/01079 (2013.01); H01L 2924/12044 (2013.01); H01L 23/04 (2013.01)
USPC ............ 361/790; 361/702; 361/704; 361/770

(58) Field of Classification Search
USPC ........................... 361/700–790; 257/700–710
See application file for complete search history.

(56) References Cited

U.S. PATENT DOCUMENTS

| | | | | |
|---|---|---|---|---|
| 4,763,225 A * | 8/1988 | Frenkel et al. ................ | 361/709 |
| 5,175,395 A * | 12/1992 | Moore .......................... | 174/372 |
| 5,455,456 A * | 10/1995 | Newman ....................... | 257/704 |
| 5,623,394 A * | 4/1997 | Sherif et al. ................... | 361/705 |
| 6,400,014 B1 * | 6/2002 | Huang et al. ................... | 257/712 |
| 6,949,880 B1 | 9/2005 | Guenther et al. | |
| 7,329,560 B2 * | 2/2008 | Gramann et al. ............... | 438/99 |
| 2002/0050398 A1 * | 5/2002 | Coico et al. ................... | 174/250 |
| 2002/0149035 A1 | 10/2002 | Yamada et al. | |
| 2003/0026077 A1 | 2/2003 | Wennemuth et al. | |
| 2003/0062518 A1 | 4/2003 | Auch et al. | |
| 2003/0094691 A1 | 5/2003 | Auch et al. | |
| 2003/0160318 A1 | 8/2003 | Guenther et al. | |
| 2004/0027066 A1 | 2/2004 | Park et al. | |
| 2004/0048033 A1 | 3/2004 | Klausmann et al. | |
| 2004/0051449 A1 | 3/2004 | Klausmann et al. | |
| 2005/0023629 A1 | 2/2005 | Ding et al. | |

(Continued)

FOREIGN PATENT DOCUMENTS

DE 91 00 665 U1 7/1992
DE 101 37 619 A1 2/2003

(Continued)

OTHER PUBLICATIONS

Won, Bumsuk, "Non-Final Office Action", U.S. Appl. No. 11/961,896, issued on Apr. 14, 2011 (9 pages).

(Continued)

Primary Examiner — Tuan T Dinh
(74) Attorney, Agent, or Firm — Fish & Richardson P.C.

(57) ABSTRACT

An electronic device includes a substrate (1), an electronic component (2) seated on the substrate (1), and a cover (3) across the electronic component (2) with a space (330) between the cover (3) and the electronic component (2). The cover (3) is configured on an inside (32) facing the electronic component (2) in such fashion that the cover (3) has at least one support structure (4, 40) protruding into the space (330).

30 Claims, 7 Drawing Sheets

(56) References Cited

U.S. PATENT DOCUMENTS

| | | |
|---|---|---|
| 2005/0269926 A1 | 12/2005 | Fukuoka et al. |
| 2006/0076886 A1 | 4/2006 | Ahn |
| 2006/0093795 A1 | 5/2006 | Wang et al. |
| 2006/0125375 A1 | 6/2006 | Hwang et al. |
| 2006/0128042 A1 | 6/2006 | Gramann et al. |
| 2006/0273304 A1 | 12/2006 | Cok |

FOREIGN PATENT DOCUMENTS

| | | |
|---|---|---|
| DE | 102 00 382 A1 | 7/2003 |
| JP | 61-32807 | 2/1986 |
| JP | 62-145336 | 6/1987 |
| JP | 6-45470 | 2/1994 |
| JP | 8-274208 | 10/1996 |
| JP | 2000-36384 | 2/2000 |
| JP | 2001-269900 | 10/2001 |
| JP | 2002-319710 | 10/2002 |
| JP | 2004-227792 | 8/2004 |
| JP | 2005-166315 | 6/2005 |
| JP | 2006-99069 | 4/2006 |
| WO | WO 92/13318 A1 | 8/1992 |
| WO | WO 98/50949 A2 | 11/1998 |
| WO | WO 99/35681 | 7/1999 |
| WO | WO 03/058713 A2 | 7/2003 |
| WO | WO 2006/100444 | 9/2006 |
| WO | WO 2006/101378 | 9/2006 |

OTHER PUBLICATIONS

Japan Patent Office, "Translation of the Notification of Reasons for Refulsals (type I office action)", JP Appl. No. 2008-12748, mailed on Jun. 16, 2011 (4 pages).

* cited by examiner

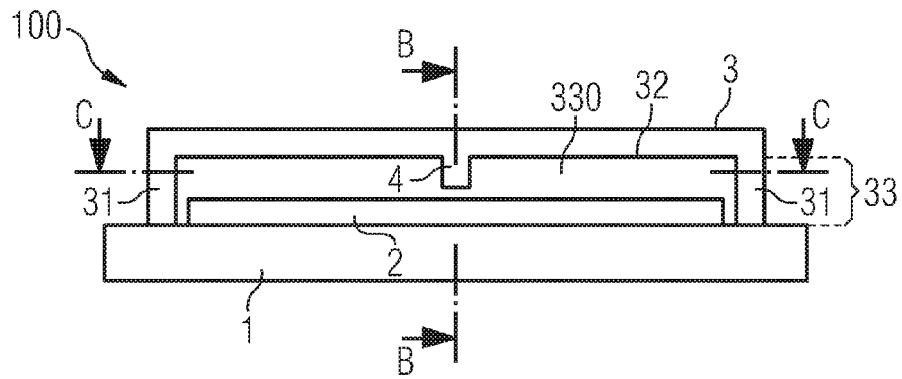
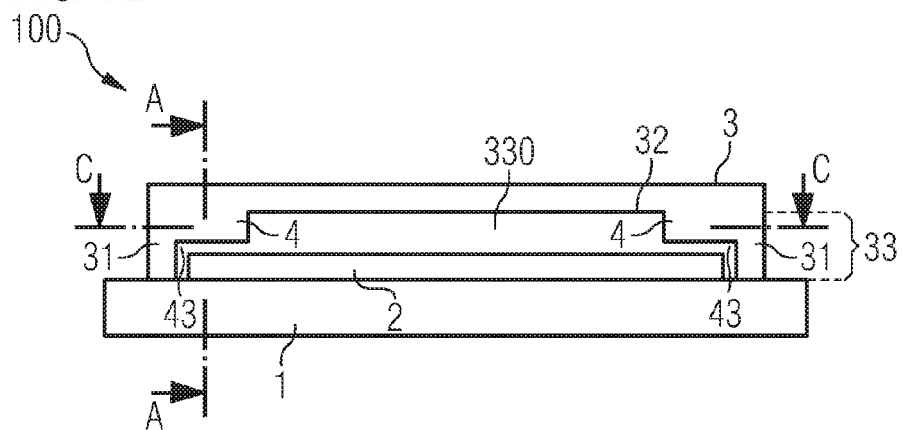
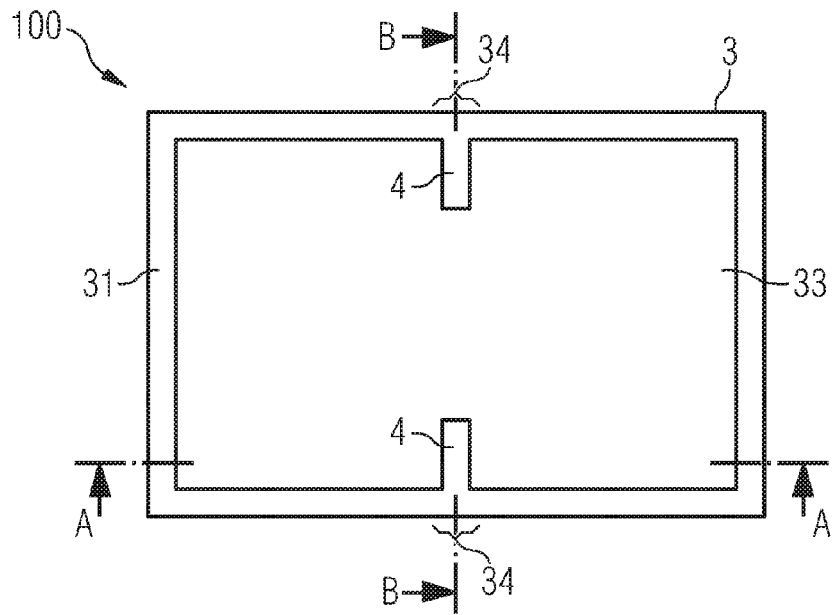

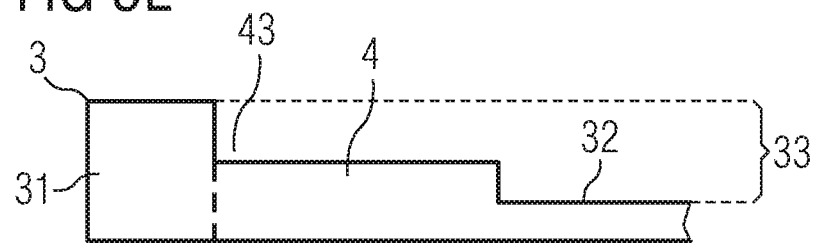
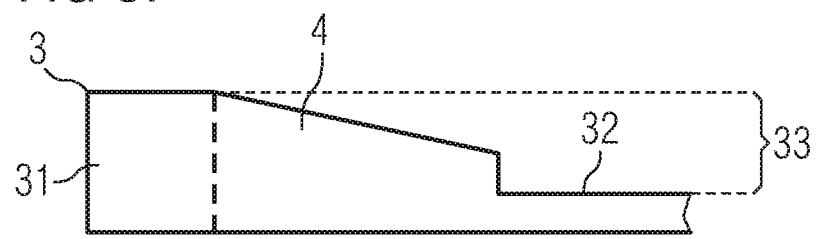
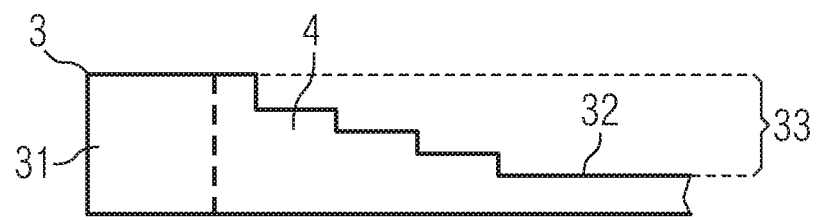

ENCAPSULATED ELECTRONIC DEVICE

CROSS-REFERENCE TO RELATED APPLICATIONS

This application claims priority to German Application Serial No. 102007003807.2, filed on Jan. 25, 2007, and German Application Serial No. 102007012504.8, filed on Mar, 15, 2007. The disclosure of each prior application is considered part of and is incorporated by reference in the disclosure of this application.

BACKGROUND

The invention pertains to packaging of an electronic component.

In flat-surface electronic components with a self-supported cover across a substrate, increasing the surface area of the components can result in the danger that the cover may leak or allow the components to be damaged by external positive or negative pressure on the cover. As a consequence, positive or negative pressures on components with an increased surface should be reduced to prevent causing damage to the surface of the component.

SUMMARY

At least one objective of embodiments of the devices described herein is to provide an electronic component, which is able to decrease the above-mentioned disadvantages. A cover with structures that protrude into the encapsulation cavity is used to solve problems posed by some conventional devices.

In one aspect, an electronic device includes but is not limited to a substrate, an electronic component seated on the substrate, and a cover across the electronic component, wherein between the cover and the electronic component is a space, and the side of the cover facing the electronic component is designed in such fashion that the cover exhibits at least one support structure extending into the space.

Due to the fact that the cover is installed above the substrate, the electronic component can be effectively protected from outside influences.

Additional advantages and advantageous embodiments and enhancements of the devices described herein can result from the following figures and their associated descriptions.

BRIEF DESCRIPTION OF DRAWINGS

FIGS. 1A to 1C are schematic views of an electronic device according to an embodiment.

FIGS. 5A to 5G are schematic sectional views of support structures according to additional embodiments.

DETAILED DESCRIPTION

Figure 2A:
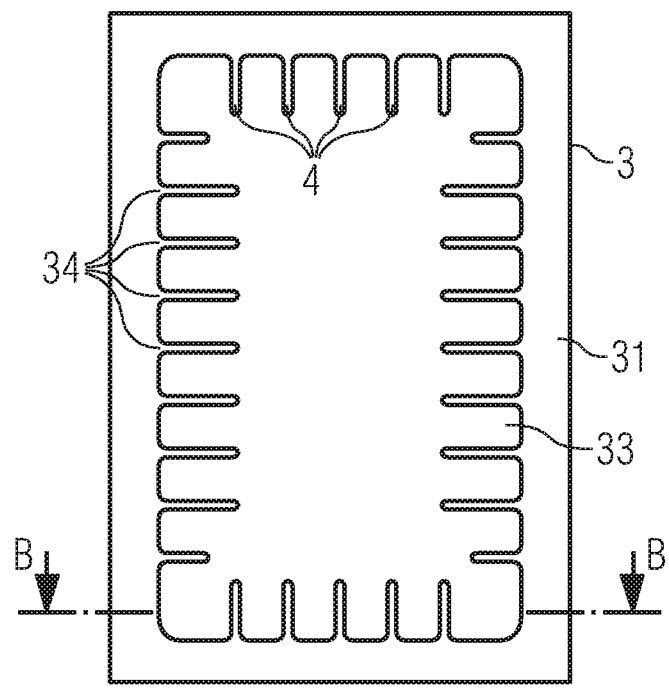
FIGS. 2A and 2B, are schematic views of a cover according to another embodiment.

A cover with support structures can have greater mechanical strength than a similar cover without support structures. Devices that are encapsulated with a large expanse of unsupported cover material can potentially bend or warp when positive or negative pressure is applied to the unsupported portion. Thus, various configurations of support structures can provide mechanical support to the cover material while making a thicker cover layer unnecessary.

The cover may have a boundary area extending around the electronic component, and the cover can be attached to the substrate by this boundary area. This allows the cover to have a large self-supported surface above the electronic component. This may mean that the cover is supported on the substrate at the boundary areas only, while the area of the cover located above the electronic component neither indirectly nor immediately lies on the substrate or on the electronic component. This creates a space between the cover and the electronic component, e.g., the cover and the substrate can form a cavity, in which the electronic component is located.

The electronic component of the electronic device can have a flat design. Along the main direction of the substrate, that is, along the surface of the substrate, the electronic component may be large in comparison to its thickness. Thus, the electronic component can be wider than the component is thick.

The larger the surface of the electronic component the more it might be necessary to provide sufficient stability and mechanical integrity for the cover. In regard to external pressures, i.e., positive and negative pressure, it might be possible that a large cover in the area above the electronic component, which may be unsupported in the center, is exposed to forces that may warp the cover or detach at least parts of the boundary area from the substrate. Such forces may be applied by positioning tools that are commonly used in electronic manufacturing, which may use a vacuum to hold an electronic device. If the boundary layer is straight and/or the cover is very thin, especially in the freely suspended area and the cover has a large surface, the chances of the cover being detached or deformed by external forces or pressures are further increased. The area above the electronic component may be a weak point of the cover regarding its mechanical integrity. Instead of increasing the thickness of the cover, the support structure, which may protrude into the space between the cover and the electronic component, can be advantageously used to increase the stability and thus the integrity of the cover. This allows the optical device to be exposed to greater positive and negative external pressures and/or forces without damage, such as during operation or during further processing steps compared to known covers without a support structure. The support structure is especially well suited to effectively counteract bending of the cover due to external pressures or forces on the cover and/or the electronic component.

The cover above the electronic component may also include a recess, which is part of the space. The cover above the electronic component can have an area which is thinner than the boundary area and which is surrounded and/or bordered and/or enclosed by the boundary area. The support structure makes it possible to increase the mechanical integrity and stability of the thinner area without having to reduce the depth of the indentation or to increase the thickness of the cover.

With the above-described electronic device it may be possible to encapsulate the electronic component on the substrate through the effective use of the cover. The stability of the cover can be increased by the support structure so that the electronic component encapsulated by the cover is protected even in the presence of large positive and/or negative pressures.

In another embodiment, the cover is located at a distance from the electronic component. The cover in this embodiment does not touch the electronic component. This is especially useful to create a clearance between the cover and the entire electronic component. In an electronic component with a large surface this would mean that the cover would have a large self-supported area, and the mechanical stability can be effectively increased by the support structure. This can reduce the likelihood of the cover being bent towards or away from the electronic component in the presence of large positive or negative pressures.

It may be advantageous for parts of the cover to be designed to form a support structure. This may include the support structure being an integral component of the cover. This can be achieved, for example, by designing the support structure and the cover in one piece. In tone embodiment, the support structure and the cover are formed from one piece. It may be possible to manufacture the support structure together with the cover in a forming process, for example injection molding, molding or casting, embossing, milling or etching. The support structures may also be attached by permanently gluing, fusing or welding them to the cover. Such single-piece construction of the cover with the support structure ensures easy manufacturability as well as high mechanical stability and integrity. If the cover exhibits an indentation, e.g., a recess, the support structures can be installed in the recess in order to cause the above-mentioned increase of mechanical stability in these areas.

In one embodiment, the support structure is designed as a rib-, bar- or plate-shaped protrusion of the cover. This may in particular mean that the support structure forms a bulge, in particular an elongated bulge, in the inside of the cover facing the electronic component. As such, the support structure may be a protuberance of the inside or form an elevation on the inside of the cover. Further, the support structure can be designed in the shape of a bar, which means that the support structure may exhibit an elongated shape raised along the inside of the cover.

It might also be advantageous if the at least one support structure extends at least partially above the electronic component. This might be advantageous especially due to the fact that the support structure can especially in this area, which may be self-supported and therefore create a weak point of a mechanical stability in the cover, provide an increase of the mechanical integrity. In doing so, the support structure may be designed to be positioned opposite to the electronic component. The support structure may in particular form a part of the inner surface of the cover, which is facing the electronic component. A space between the support structure and the electronic component can result in a mechanically stable, self-supported cover above the electronic component.

Furthermore, the support structure may form a bar extending from the boundary area across a part of the cover. This can mean that the support structure borders on the boundary area or touches it and extends away from it. In doing so, the support structure may have the shape of a swell or protuberance or elevation from the boundary area and extend across the inner surface of the cover.

The cover may have at least two boundary portions located opposite to each other, and the support structure may extend from one boundary portion toward the opposite boundary portion. The support structure may extend away from one of the boundary portions with which it forms an angle, such as a right angle. The angle may also be smaller than a right angle and greater than 30°, such as greater or equal to 45°.

Furthermore, the support structure may touch the boundary portions that are opposite to each other. This can mean that the support structure extends from one boundary portion to the opposite boundary portion. Based on this, the support structure may span the cover between the opposite portions so that the support structure spans the electronic component. This can increase of the mechanical stability at least along the progression of the support structure since the bulge or step on the inside of the cover formed by the support structure may reduce any bending of the cover in response to external pressure. If the cover has a recess as described above, then the support structure can divide the recess into two separate sections.

In another embodiment, the support structure may have a height that decreases as it moves away from the boundary area. The height of the support structure may have a height that is measured relative to the inside of the cover. In particular, the support structure may taper to a smaller height as it moves away further from the boundary area, wherein the support structure can be the same height as the boundary area directly at the boundary area, and that the height can get smaller as the distance increases. This change in height may be provided by a continuous or a gradual change in height. As the height decreases, the profile may get narrower as it moves away from the boundary area. The support structure may have a height that is smaller or equal to the depth of the recess in the cover. This means that the support structure may extend into the recess and have a height that is equal to or smaller than the height of the boundary area. The support structure and the boundary area may also form a step. The step can ensure that when external pressure is applied to the cover, which may cause the cover to bend towards the electronic component, the cover and the support structure cannot touch the electronic component.

In another embodiment, the support structure has branching bars. Such a branch or ramification may be formed in such fashion that additional bars extend from the main direction of the support structure at a specific angle. This angle may be a right angle but can also be smaller than 90° and greater than 15°. Especially in a support structure that extends far from the boundary area inside the cover such a ramification with branching bars can further increase the mechanical stability and integrity of the cover. The support structure may, for example, have V- or T-shaped or cross-shaped branches or combinations thereof.

In another embodiment, the cover has multiple support structures bordering on multiple sections of the boundary area and extending away from them, which can increase the mechanical stability of the cover in the above-described fashion based on the multiple sections. The multiple support structures may be configured next to one another. This may mean that multiple of the same or similar support structures extend adjacently from the boundary area in same or similar fashion to a section of the boundary area located on the opposite side. Furthermore, at least two support structures may be configured opposite from each other. This may mean that a first support structure is located in a first section of the boundary area and a second support structure in a second section of the boundary area, with the first and the second section of the boundary area located opposite from each other.

In one configuration, the multiple support structures are located along the entire boundary area. This can mean in particular that the support structures enclose a self-supported area of the cover. In particular, the supporting structures can be configured at equal distances from each other. This evenly and globally increases the stability of the cover from the entire boundary area that encloses the electronic component.

In another embodiment, the inside of the cover contains a getter material. The getter material may be applied next to a support structure on the inside of the cover. This may mean that the getter material is configured between the support structure and the boundary area. In the case of multiple support structures, the getter material can also be between the support structures. The cover may furthermore have a recess, in which the getter material is configured. The getter material may then have a specific thickness, which may be smaller or equal to the depth of the recess in the cover.

The getter material may be an oxidizable material, which may react with oxygen and humidity, thereby binding these harmful substances. Suitable oxidizable materials include metals of the group of alkali and alkaline earth metals. Also suitable are other metals, such as titanium or oxidizable, non-metallic materials.

In another embodiment, a sealing compound is configured between the boundary area of the cover and the substrate.

The sealing compound may seal the electronic component from the environment. The sealing compound can extend around the electronic component and enclosing the component. Suitable material for the sealing compound may be a resin, such as a reaction resin, which may facilitate a bonding or sealing connection. The reaction resin may be in the form of a resin with single or multiple components, which may be curable with heat, light or a combination thereof. Suitable materials can be found in the class of silicones, epoxies, acrylates, imides or mixtures thereof, which may be used as sealants and adhesives. The sealing material may furthermore exhibit additional layers, such as protective layers made of plastics or the above-mentioned resins. The configuration of the sealing material between the boundary area of the cover and the substrate can result in an effective encapsulation of the electronic component.

The sealant may have a height that prevents the support structure from touching the electronic component. The support structure may, for example, have a height matching the depth of a recess in the cover. If the thickness of the sealing material is selected such that it has a height greater than the height of the electronic component, then the cover can be above the electronic component so that the at least one support structure extends across the electronic component without touching it. In some embodiments, the total of the sealing material height and the depth of the recess in the cover is greater than the total of the height of the electronic component and the height of the support structure. By selecting the thickness of the sealing material appropriately, the above-described configuration of the cover above the electronic component can form a space between the cover and the electronic component.

In another embodiment, the cover has a moldable, embossable, millable, and/or etchable material allowing the manufacture of a cover with at least one support structure. Appropriate materials are, for example, glass, plastics, metals or combinations thereof. The cover may furthermore be designed in the form of a laminate. It may be particularly advantageous for the cover to have barrier layers with a low permeability for humidity and/or oxygen.

In one embodiment, the electronic component has a sequence of semiconductor layers. The electronic component may be designed as an optoelectronic component with a sequence of semiconductor layers with an active area. In one embodiment, the optoelectronic component is a radiation-emitting optoelectronic component such as a light-emitting diode or a radiation-receiving component such as a photo diode.

In some embodiments, the design of the optoelectronic component is an organic light-emitting diode (OLED).

The OLED may, for example, have in one active area a first electrode on the substrate. Applied above the first electrode may be a functional area with one or multiple functional layers of organic materials. The functional layers may be electron transport layers, electric luminescent layers and/or hole transport layers. Applied above the functional layers may be a second electrode. In the functional layers, electron and hole injection and recombination may be used to generate electromagnetic radiation of a single wavelength or a range of wavelengths causing the viewer to experience an impression of single color, multi-color and/or mixed-color light.

In particular, the first electrode and/or the second electrode may be laminar or alternatively partitioned into electrode sections. For example, the first electrode may be designed in the form of a first set of parallel adjacent electrode strips and the second electrode as a second set of parallel adjacent electrode strips running perpendicular to the first set of electrodes. Overlapping of the first and the second electrode strip may therefore be designed as separately controllable illumination areas, e.g., pixels. Furthermore, only the first or the second electrode may be structured. In one configuration, the first and/or the second electrode or the electrode sections are electrically connected to the first conductor paths. In doing so, one electrode or electrode section may transition into a first conductor path or may be configured separately from a first conductor path and electrically connected to it.

In a further embodiment the first substrate is glass. The first substrate may alternatively or additionally also include quartz, plastic films, metal, metal films, silicon wafers or any other suitable substrate material. If the electronic component is an OLED especially designed as a so-called "bottom emitter", i.e., the radiation generated in the functional layers is emitted through the first substrate, the substrate may be transparent to at least part of electromagnetic radiation generated in the active region.

In the bottom emitter configuration, the first electrode may advantageously be transparent to at least a portion of the electromagnetic radiation generated in the active region as well. A transparent first electrode designed as an anode and therefore functioning as a hole-injecting material may, for example, be a transparent, electrically conductive oxide or be made of a transparent, conductive oxide. Transparent, electrically conductive oxides (TCO) are transparent, conductive materials, usually metal oxides like zinc oxide, tin oxide, cadmium oxide, titanium oxide, indium oxide or especially preferred indium tin oxide (ITO). In addition to binary metal-oxygen combinations like ZnO, $SnO_2$ or $In_2O_3$, ternary metal-oxygen combinations like $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent electrically conductive oxides also belong to the TCO group. Furthermore, the TCO's need not necessarily be stoichiometrically composed and may also be p- or n-doped.

The functional layers may include organic polymers, organic oligomers, organic monomers, organic small, non-polymer molecules ("small molecules") or combinations thereof. Appropriate materials as well as configurations and structuring of the materials for functional layers are known and will therefore not be explained any further at this point.

The second electrode may be a cathode and therefore serve as electron-injecting material. Advantageous cathode materials include aluminum, barium, indium, silver, gold, magnesium, calcium or lithium as well as compounds, combinations or alloys thereof. The second electrode may additionally or alternatively also be transparent and/or the first electrode may be designed as the cathode and the second electrode may be designed as the anode. This means in particular that the OLED may also be designed as a "top emitter".

The active range may also exhibit characteristics and components for active and passive displays and illumination devices like TFT's.

In the embodiments and figures, equal or equally functioning components are referenced with same numbers or characters. The indicated elements and their dimensions in relation to each other are not true to scale, instead, the thickness and size of individual elements like layers, subassemblies, components and areas may have been exaggerated for better representation and/or understanding.

FIGS. 1A to 1C show an embodiment of an electronic device 100, wherein FIGS. 1A to 1C indicate sectional views along sectional planes AA, BB and CC. The following description applies equally to all three FIGS. 1A to 1C.

The electronic device 100 includes a substrate 1 to which an electronic component 2 is attached. The electronic component 2 is flat and in implementations may be a flat OLED. Located above the electronic component is a cover 3, wherein the cover 3 has a boundary area 31 surrounding the electronic component 2. The cover 3 is attached to the substrate 1 via the boundary area 31. The cover 3 has a recess 33. Together, the substrate 1 and the cover 3 form a cavity, in which the electronic component 2 is installed. The cover 3 is designed to exhibit an inner surface 32, which faces the electronic component 2 and the substrate 1. The cover is furthermore designed to include a space 330 between the cover 3 and the electronic component 2, which means that the cover 3 is arranged above the electronic component 2 in such fashion as not to touch the electronic component 2.

The cover 3 is suited to protect the electronic component 2 from harmful external forces and to encapsulate the electronic component 2. When pressure is applied to the self-supported part 7 of the cover between the boundary areas 31, the self-supporting part 7 can have a tendency to warp, i.e., to bend. Applied positive (over) pressure may cause an indentation in the self-supported part 7. The mechanical stability of the cover 3 depends mainly on the size of the cover 3 and the depth of the recess 33. The size of the cover 3 is the dimension of the cover parallel to the substrate plane, i.e., the length of the sides, as well as the thickness of the cover, especially at the boundary areas, and the ratio of the side lengths.

In order to increase the mechanical stability of the cover 3 in the self-supported part 7 between the boundary areas 31 the cover also has support structures 4. The support structures 4 are designed to extend from each section 34 of the boundary area along the inside 32 of the cover across the electronic component 2. Each of the support structures 4 has the effect that when pressure and/or force is applied to the electronic device 100, especially to the self-supported part 7 of the cover 3 between the boundary areas 31, any potential bending of this self-supported part can be reduced. In particular, the support structures 4 are designed in the shape of bars or ribs, and are made together with the cover 3 in one piece. This means that the support structures 4 are integrally formed with the cover 3 from the same material. The cover shown in this embodiment is a glass cover with glass bars.

The electronic device 100 may be designed in particular with a flat surface of at least one square decimeter to several square decimeters. As an alternative to the rectangular shape of the cover and the electronic component 2 and electronic component shown in the figures, any other shape may be selected. The electronic device 100 may be circular or elliptical or may have a shape with no corners.

In the embodiment shown, the supporting structures 4 border two opposite sections 34 of the boundary area 31 and extend from them towards each other. Thus, the bars 4 form a right angle with the boundary area 31. Alternatively, the bars 4 may also form a different angle as described further herein. Furthermore, the bars 4 each form a step with the boundary area 31. This means that the bars 4, viewed from the inside 32 of the cover 3, form a gap above the electronic component 2 that is smaller than the gap between the electronic component 2 and the portion of the cover 3 free of supporting structures 4.

The embodiments shown in the following figures represent variations and enhancements of the embodiment shown in FIGS. 1A to 1C. The further description of the following embodiments is therefore limited to a description of the variations and enhancements.

Figure 2B:
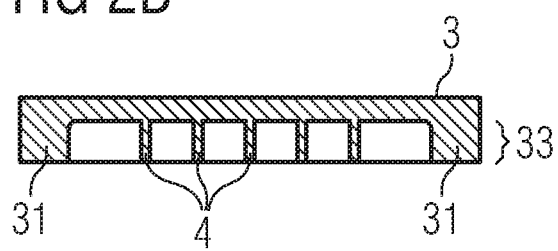

FIGS. 2A and 2B show an embodiment for the cover 3. The cover 3 of FIGS. 2A and 2B could be used in place of the cover 3 of the electronic device 100 in FIGS. 1A to 1C.

The cover 3 shown in FIGS. 2A and 2B is a single piece made of glass and has multiple support structures 4 designed as bars. As can be obtained from FIGS. 2A and 2B, the bars have a height that matches and is equal to the depth of the recess 33 of the cover 3. The support structures 4 are at equal distances from one another and extend from multiple sections 34 of the boundary area 31 in pairs along the inside of the cover 3 towards each other.

Cover 3, which can be a molded cover, enables an electronic device having a cover 3 with the boundary area 31 enclosing an area of about 22 cm2 to withstand a positive (over) pressure of up to 5 bar and a negative (under) pressure of up to 10 mbar. That is, the device will not be prone to breaking or cracking, such as in the sealing region between the cap and the substrate. The sealing region can be the weakest portion of the device, and can fail by allowing the cover to delaminate from the substrate. A comparably dimensioned glass cover not having the support structures 4 allows an electronic device having such cover to withstand a positive pressure of up to 1.5 bar and a negative pressure of up to 500 mbar only. The embodiment of the cover 3 represented in FIGS. 2A and 2B can therefore be used to increase the mechanical stability and integrity of the electronic device by up to 500%. This means that this type of electronic device provides a reliable encapsulation for an electronic component for the above-mentioned pressures.

Figure 3A:
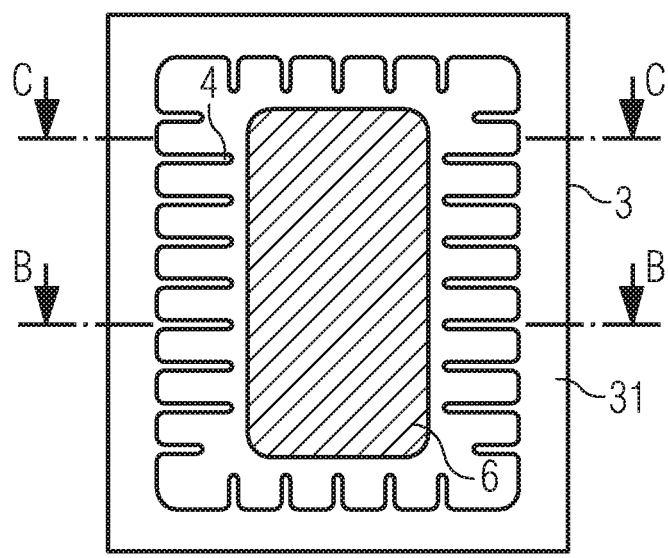
FIGS. 3A to 3C are schematic views of an electronic device and covers according to an additional embodiment.
Figure 3B:
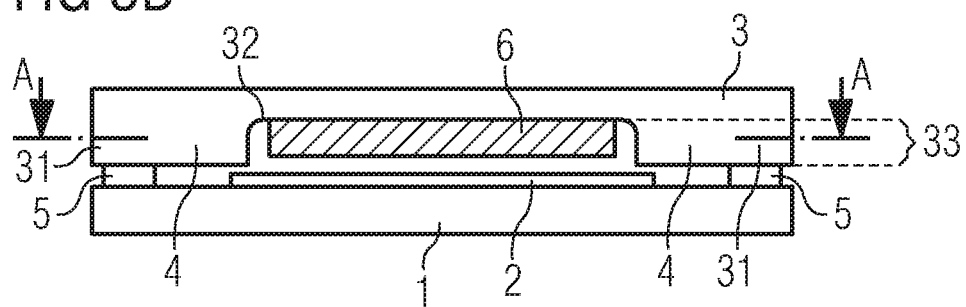
Figure 3C:
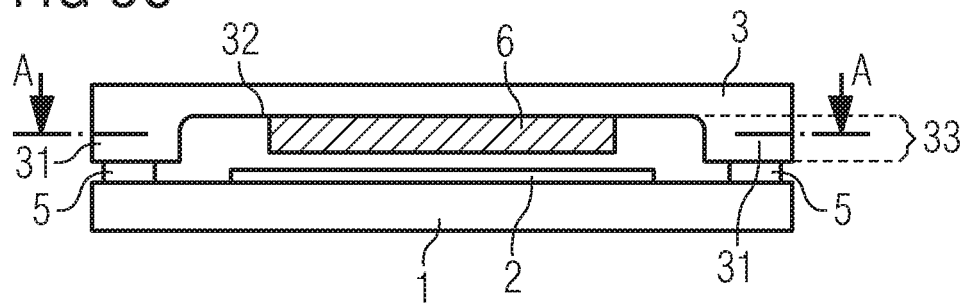

Shown in FIGS. 3A to 3C is an embodiment for an electronic device 300. The electronic device 300 has a cover 3 matching the cover 3 shown in the previous embodiment. The cover 3 is attached to the substrate 1 with a sealing compound 5 between the boundary area 31 and the cover 3. The sealing compound 5 has a material as described herein and is particularly suited to seal the electronic component 2 from the environment.

Referring back to FIGS. 2A and 2B, the height of the bar-shaped support structures 4 is equal to the height of the recess 33 in the cover 3, and the bar-shaped support structures 4 extend at least partially across the electronic component 2, therefore the thickness of the sealing material 5 has been selected to have a height that ensures that the cover 3 together with the support structures 4 does not touch the electronic component 2. This means that the sealing material 5 has a height that is greater than the height of the electronic component 2. Applied in the recess 33 on the inside 32 of the cover 3 between the support structures 4 is a getter material 6. The getter material 6 is designed to absorb humidity and oxygen in order to prevent and/or minimize damage to the electronic component 2 due to harmful substances. In addition, or as an alternative to the configuration of the getter material shown, the getter material may also be applied to the in-between spaces along the direction of the support structures 4. A gap between the getter material 6 and the support structures 4 as well as a space between the electronic component 2 and the cover 3 may be advantageous as well in order to absorb humidity or oxygen within the entire cavity that is formed by the cover 3 and the substrate 1.

The depth of the recess 33 can be selected such that the getter material 6 located above the electronic component 2 does not touch the electronic component. This means that the recess has a depth that is at least equal to the thickness of the getter material. The length of the support structures is furthermore determined by the dimensioning of the electronic device and the area required by the getter material 6.

The shown embodiment of the cover allows the cover 3 as well as the electronic device 300 to be processed and operated at the previously described pressures and associated forces.

Figure 4A:
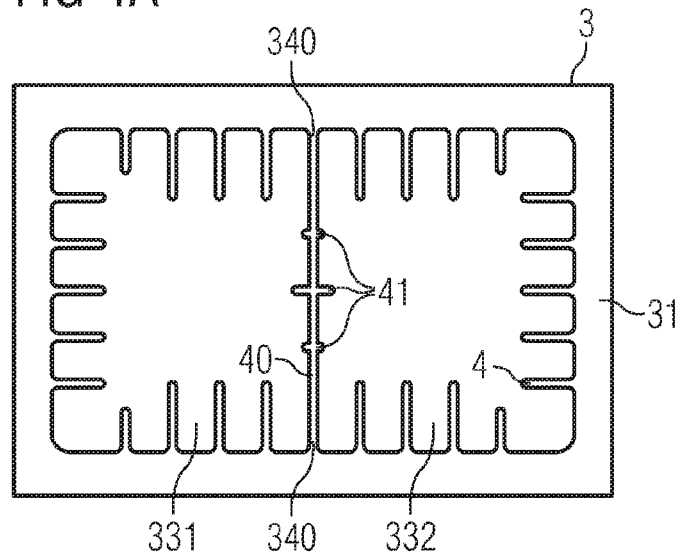
FIGS. 4A to 4B are schematic views of a cover according to another embodiment.
Figure 4B:
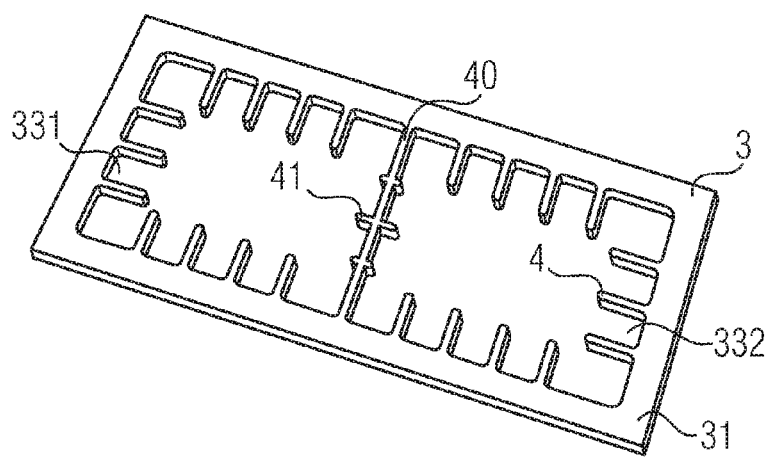
Figure 4C:
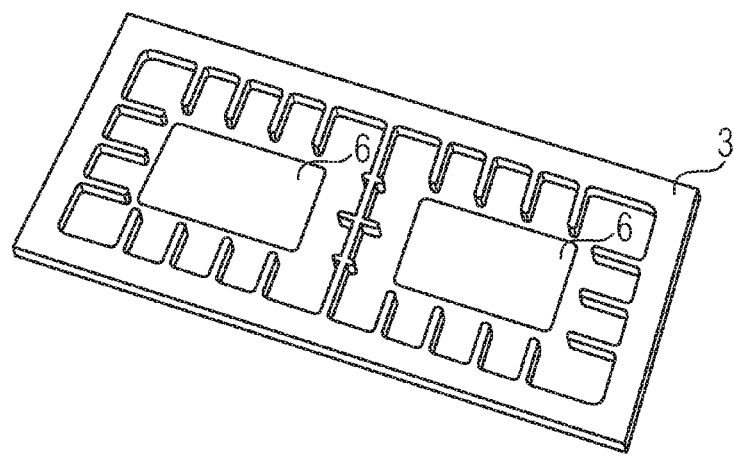
FIG. 4C is a schematic view of a cover with getter material.

FIGS. 4A to 4C show an additional embodiment of a cover. FIG. 4A is a cross-sectional view of the 3D-representation of the cover 3 in FIG. 4B. The cover 3 has a support structure 40 extending between two sections 340 of the boundary area 31 and touching the sections 340 on the opposite side. This allows the bar-shaped support structure 40 to divide the recess of the cover 3 into to separate sections 331 and 332. This type of support structure 40 can significantly increase the mechanical stability and integrity of the cover 3. The support structure 40 also has bars 41 that are branching off. These branching bars 41 extend from the support structure 40 in such manner that they protrude from the support structure into the sections 331 and 332 of the recess in the cover 3 at a right angle. As described above, the angle at which the support structures 4, 40, and 41 are extending from the boundary area 31 and/or the support structure 40, may be different from 90 degrees. In order to achieve a higher degree of stability the bars 41 may, for example, extend to the opposite boundary area 31 and either touch it or transition into it.

Optionally, as shown in FIG. 4C, sections 331 and 332 may contain getter materials 6 between support structures 4, 40, 41.

The embodiments pursuant to FIGS. 5A to 5G refer to embodiments of the support structures. All figures only show sections of covers 3.

Figure 5A:
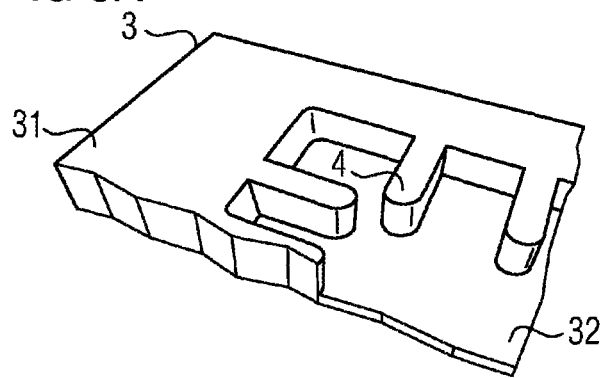
Figure 5B:
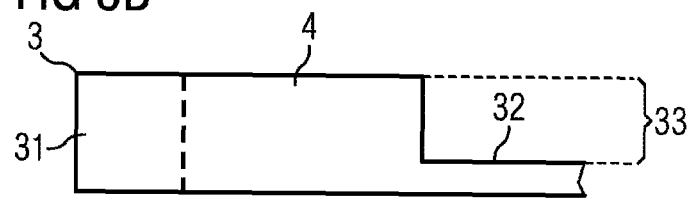

FIG. 5A shows a 3D-representation of support structures 4 extending from the boundary area along the inside 32 of the cover 3 into the recess 33. The height of the support structures, which may be bar- or fin-shaped matches the height of the boundary area 31 and thus the depth of the recess 33. FIG. 5B shows a schematic cross-sectional view. This type of support structure, especially the fact that the support structures 4 have the same height as the recess 33 and the boundary area 31, allows the economical and easy manufacturing of the cover.

Figure 5C:
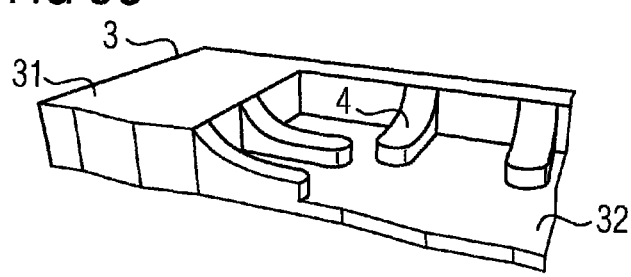
Figure 5D:
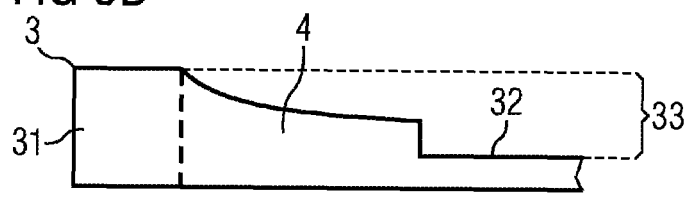

FIGS. 5C and 5D represent a perspective and a cross-sectional view of a section of the cover 3 pursuant to another embodiment, wherein the height of the bar-shaped support structures 4 decreases as they move away from the boundary area 31.

FIG. 5E shows a cross-sectional view of a bar-shaped support structure 4 creating a step 43 with the boundary area 31. The height of the support structure in relation to the inside 32 of the cover 3 remains the same along the dimensional direction of the support structure 4 and is less than the depth of the recess 33.

The height of the support structure shown in FIG. 5F gradually decreases, as is the case for the embodiments in FIGS. 5C and 5D, from the boundary area along the dimensional direction of the support structure.

The support structure 4 shown in FIG. 5G includes several steps, which also decrease in height away as the support structure 4 moves from the boundary area 31 and along the dimensional direction of the support structure.

The embodiments of support structures 4 shown in FIGS. 5C to 5G are suitable for covers that are required to provide high mechanical stability and integrity in the presence of very high or very low pressures. Such support structures are also appropriate for electronic devices with large surfaces where, due to the larger self-supported area 7 between the boundary area 31 and the cover 3, a cover without the support structures is likely bend to a large degree in response to pressure.

Figure 6A:
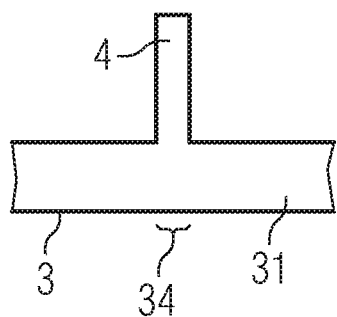
FIGS. 6A to 6E are schematic top views of support structures according to additional embodiments.
Figure 6B:
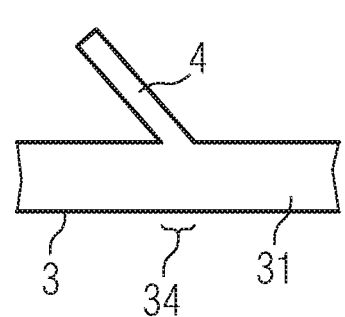
Figure 6C:
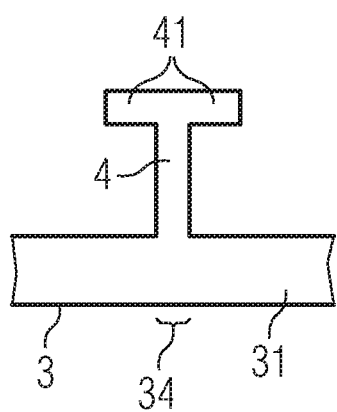
Figure 6D:
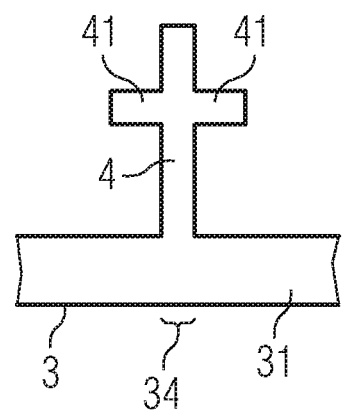
Figure 6E:
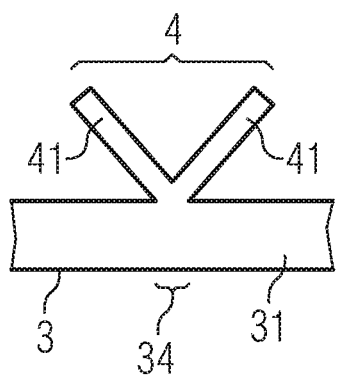

FIGS. 6A to 6E show top views of embodiments of different types of support structures 4. FIG. 6A represents the previously shown straight fin or bar shape extending away from section 34 of the boundary area 31 at a right angle. FIG. 6B also shows the straight fin and bar shape, forming an acute angle with the boundary area 31. FIG. 6C shows a support structure 4 with branches 41, so that the result is a T-shaped support structure. FIG. 6D shows a support structure 4 with branches 41 resulting in a cross-shaped support structure. FIG. 6E represents a support structure 4 configured as two V-shaped branches 41. The support structure may also be a combination of the support structures shown in the embodiments.

The structures described herein allow for the possibility of applying getter material in recesses formed between the support structures. Further, the stability in the sealing region between the cap can be increased while the flexibility of a thin can be maintained.

The invention is not limited to the described embodiments. The invention rather also includes any new characteristic and any combination of characteristics, especially any combination of the characteristics in the patent claims, even if this characteristic is not explicitly listed in the patent claims or embodiments.

What is claimed is:

1. An electronic device, comprising:
   a substrate;
   an electronic component on the substrate, the electronic component having a first surface facing away from the substrate; and
   a cover across the electronic component, wherein a space is between the cover and the electronic component, and the cover and any material attached to the cover disposed within the space define a second surface, and the inside of the cover faces the electronic component and has at least one support structure protruding into the space, wherein the at least one support structure increases the stability and integrity of the cover in response to external forces on the cover;
   wherein the first surface of the electronic component and the second surface define a gap extending above the entire first surface;
   wherein the cover has a substantially vertical boundary portion that is attached to the substrate and surrounds the electronic component and a substantially horizontal cap portion that is disposed over the electronic component;
   wherein the support structure extends from the boundary portion and is a protrusion; and
   wherein the support structure has a height that decreases with increasing distance from the boundary portion so that the support structure tapers in a direction away from the boundary portion to a height that is smaller than a height of the support structure at the boundary portion.

2. The device of claim 1, wherein the electronic component is encapsulated by the cover.

3. The device of claim 1, wherein the support structure and cover are formed as one piece.

4. The device of claim 1, wherein the support structure is a rib-shaped, bar-shaped or fin-shaped.

5. The device of claim 1, wherein the support structure has a curved profile.

6. The device of claim 1, wherein the support structure extends at least partially across the electronic component.

7. The device of claim 1, wherein the support structure is located between the electronic component and the cover.

8. The device of claim 1, wherein the support structure has branching bars.

9. The device of claim 1, further comprising a sealing material between the boundary portion of the cover and the substrate, the sealing material sealing the electronic component from the environment.

10. The device of claim 1, wherein the support structure is a bar extending away from a boundary portion.

11. The device of claim 1, wherein the cover has two boundary portions opposite from one another on either side of the electronic component and the support structure extends from a first boundary portion of the two boundary portions toward a second boundary portion of the two boundary portions.

12. The device of claim 1, wherein the support structure divides the recess into two separate sections.

13. The device of claim 1, wherein the support structure has a height less than or equal to the depth of the recess.

14. The device of claim 1, wherein the support structure forms a step with the boundary portion.

15. The device of claim 1, wherein the cover has a plurality of support structures.

16. The device of claim 1, further comprising getter material next to the support structure.

17. The device of claim 1, wherein the electronic component includes a sequence of semiconductor layers.

18. The device of claim 1, wherein the electronic component includes an optoelectronic component.

19. The device of claim 1, wherein the electronic component has a flat surface.

20. The device of claim 1, wherein there is a gap between the support structure and the electronic component.

21. The device of claim 9, wherein the sealing material has a height sufficient to maintain a space between the support structure and the electronic component.

22. The device of claim 9, wherein the sealing material has a height greater than a height of the electronic component.

23. The device of claim 11, wherein the support structure contacts the first boundary portion and the second boundary portion.

24. The device of claim 15, wherein the plurality of support structures are adjacent to one another.

25. The device of claim 15, wherein the plurality of support structures extend along an entirety of the boundary portion.

26. The device of claim 17, wherein one of the semiconductor layers includes an organic material.

27. The device of claim 18, wherein the optoelectronic component is an organic light-emitting diode.

28. An electronic device, comprising:
a substrate;
an electronic component on the substrate; and
a cover across the electronic component,
wherein a space is between the cover and the electronic component, and the inside of the cover faces the electronic component and has at least one support structure protruding into the space,
wherein the at least one support structure is at least partially disposed directly above the electronic component and has a width smaller than a width of the electronic component,
wherein the cover includes a substantially vertical boundary portion that is attached to the substrate and surrounds the electronic component and a substantially horizontal cap portion that is disposed over the electronic component, and
wherein the support structure is a protrusion disposed at an intersection between the boundary portion and the cap portion.

29. The electronic device of claim 28, wherein the support structure is disposed in direct contact with the boundary portion.

30. An electronic device, comprising:
a substrate;
an electronic component on the substrate; and
a cover across the electronic component,
wherein a space is between the cover and the electronic component, and the inside of the cover faces the electronic component and has at least one support structure protruding into the space,
wherein the at least one support structure is at least partially disposed directly above the electronic component, and the at least one support structure and the electronic component define a clearance therebetween,
wherein the cover includes a substantially vertical boundary portion that is attached to the substrate and surrounds the electronic component and a substantially horizontal cap portion that is disposed over the electronic component, and
wherein the support structure is a protrusion disposed at an intersection between the boundary portion and the cap portion.

* * * * *